United States Patent
Kobayashi

(10) Patent No.: US 9,825,603 B2
(45) Date of Patent: Nov. 21, 2017

(54) ACTIVE DRAIN TERMINATED DISTRIBUTED AMPLIFIER

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/225,131

(22) Filed: Aug. 1, 2016

(65) Prior Publication Data

US 2017/0099038 A1  Apr. 6, 2017

Related U.S. Application Data

(60) Provisional application No. 62/237,014, filed on Oct. 5, 2015.

(51) Int. Cl.
*H03F 3/60* (2006.01)
*H03F 3/195* (2006.01)

(52) U.S. Cl.
CPC ........... *H03F 3/604* (2013.01); *H03F 3/195* (2013.01); *H03F 2200/18* (2013.01); *H03F 2200/387* (2013.01); *H03F 2200/75* (2013.01)

(58) Field of Classification Search
None
See application file for complete search history.

(56) References Cited

U.S. PATENT DOCUMENTS

| | | | |
|---|---|---|---|
| 2,957,143 A | * | 10/1960 | Enloe .................. H03F 1/18 330/286 |
| 4,540,954 A | | 9/1985 | Apel |
| 5,208,547 A | | 5/1993 | Schindler |
| 5,361,038 A | | 11/1994 | Allen et al. |
| 5,365,197 A | | 11/1994 | Ikalainen |
| 5,559,472 A | | 9/1996 | Kobayashi |
| 6,049,250 A | | 4/2000 | Kintis et al. |
| 6,894,566 B2 | | 5/2005 | Claveau et al. |

(Continued)

OTHER PUBLICATIONS

Author Unknown, "HMC1087," Analog Devices, Hittite, Datasheet, vol. 04.1014, Date Unknown, 12 pages.

(Continued)

*Primary Examiner* — Patricia T Nguyen
(74) *Attorney, Agent, or Firm* — Withrow & Terranova, P.L.L.C.

(57) ABSTRACT

A distributed amplifier is disclosed having a plurality of amplifier sections, each having an input gate and an output drain, and a first plurality of inductive elements coupled in series between a DA input terminal and a gate termination terminal to form a first plurality of connection nodes. Each of the connection nodes is coupled to a corresponding adjacent pair of the first plurality of inductive elements and to a corresponding input gate of the plurality of amplifier sections. A second plurality of inductive elements is coupled in series between a drain termination terminal and a DA output terminal to form a second plurality of connection nodes, each being coupled to a corresponding adjacent pair of the second plurality of inductive elements and to a corresponding output drain of the plurality of amplifier sections. An active impedance termination circuitry has a termination output coupled to the drain termination terminal.

21 Claims, 11 Drawing Sheets

(56) References Cited

U.S. PATENT DOCUMENTS

| | | | |
|---|---|---|---|
| 7,804,362 | B2 | 9/2010 | Nguyen |
| 8,035,449 | B1 | 10/2011 | Kobayashi |
| 8,058,930 | B1 | 11/2011 | Kobayashi |
| 8,451,059 | B1 | 5/2013 | Kobayashi |
| 8,665,022 | B2 | 3/2014 | Kobayashi |
| 8,823,455 | B2 | 9/2014 | Kobayashi |
| 2003/0184384 | A1* | 10/2003 | Orr .......... H03F 1/565 330/286 |
| 2010/0283546 | A1* | 11/2010 | Visser .......... H03F 1/18 330/278 |
| 2012/0086511 | A1* | 4/2012 | Nilsson .......... H03F 1/56 330/277 |
| 2014/0111279 | A1* | 4/2014 | Brobston .......... H03F 1/0222 330/286 |

OTHER PUBLICATIONS

Claveau, Régis et al., "Novel Active Load for 40 Gbps Optical Modulator Drivers," 33rd European Microwave Conference, 2003, Munich, Germany, pp. 1095-1097.

Coers, Malte et al., "DC to 6.5 GHz Highly Linear Low-Noise AlGaN/GaN Traveling Wave Amplifier with Diode Predistortion," 2014 IEEE MTT-S International Microwave Symposium, Jun. 1-6, 2014, IEEE, 4 pages.

Ikalainen, Pertti K., "Low-Noise Distributed Amplifier with Active Load," IEEE Microwave and Guided Wave Letters, vol. 6, No. 1, Jan. 1996, pp. 7-9.

Kawashima, Munenari et al., "A Low-Noise Distributed Amplifier Using Cascode-Connected BJTs Terminal Circuit," Proceedings of AMPC2001, 2001, IEEE, pp. 21-24.

Kimura, Shunji et al., "0-40 GHz GaAs MESFET Distributed Baseband Amplifier IC's for High-Speed Optical Transmission," IEEE Transactions on Microwave Theory and Techniques, vol. 44, No. 11, Nov. 1996, pp. 2076-2082.

Kobayashi, Kevin W. et al., "A Novel 100 MHz-45 Ghz Input-Termination-Less Distributed Amplifier Design With Low-Frequency Low-Noise and High Linearity Implemented With A 6 Inch 0.15 μm GaN—SiC Wafer Process Technology, " IEEE Journal of Solid-State Circuits, vol. 51, No. 9, Sep. 2016, pp. 201-2026.

Kobayashi, Kevin W. et al., "A novel HBT Distributed Amplifier Design Topology based on Attenuation Compensation Techniques," IEEE Transactions on Microwave Theory and Techniques, vol. 42, No. 12, 1994, pp. 2583-2589.

Kobayashi, Kevin W. et al., "Extending the Bandwidth Performance of Heterojunction Bipolar Transistor-Based Distributed Amplifiers," IEEE Transactions on Microwave Theory and Techniques, vol. 44, No. 5, May 1996, pp. 739-748.

Kobayashi, Kevin W. et al., "Multi-Decade GaN HEMT Cascode-Distributed Power Amplifier with baseband Performance," 2009 IEEE Radio Frequency Integrated Circuits Symposium, 2009, IEEE, pp.369-372.

Moon, Jeong-Sun et al., "Wideband Linear Distributed GaN HEMT MMIC Power Amplifier with a Record OIP3/Pdc," 2016 IEEE Topical Conference on PAWR Applications, Jan. 24-27, 2016, IEEE, pp. 5-7.

Pornpromlikit, Sataporn et al., "A Watt-Level Stacked-FET Linear Power Amplifier in Silicon-on-Insulator CMOS," IEEE Transactions on Microwave Theory and Techniques, vol. 58, No. 1, Jan. 2010, pp.57-64.

Robertson, I. D. et al., "Ultrawideband Biasing of MMIC Distributed Amplifiers Using Improved Active Load," Electronics Letters, vol. 27, No. 21, Oct. 10, 1991, pp. 1907-1908.

Yamaguchi, Yo et al., "A Wideband GaN Low Noise Amplifier for a Frequency Sensing System, "Proceedings of Asia-Pacific Microwave Conference 2014, TH1B-3, Nov. 4-7, 2014, IEICE, pp. 420-422.

* cited by examiner

ACTIVE DRAIN TERMINATED DISTRIBUTED AMPLIFIER

RELATED APPLICATIONS

This application claims the benefit of provisional patent application No. 62/237,014, filed Oct. 5, 2015, the disclosure of which is hereby incorporated herein by reference in its entirety.

FIELD OF THE DISCLOSURE

The present disclosure relates to distributed amplifiers (DA), and in particular to DAs with an active drain termination.

BACKGROUND

Several different amplifier applications require an amplifier having a large gain-bandwidth product. For example, RF signals on optical fibers may require large gain-bandwidth product amplifiers that are highly linear. Some broadband fiber and RF communications applications may require large gain-bandwidth product amplifiers to provide high spectral efficiency. Software configurable communications systems may require an amplifier having a large gain-bandwidth product and a very wide operating bandwidth, which may span baseband frequencies to microwave frequencies. Baseband-to-microwave instrumentation may require an amplifier having a large gain-bandwidth product and a very wide operating bandwidth.

Distributed amplifiers (DAs) typically utilize multiple transconductance elements coupled together to provide an amplifier having a larger gain-bandwidth product than is possible with an amplifier using a single comparable transconductance element. A DA may have an input line of inductive elements or transmission line sections coupled in series and a parallel output line of inductive elements or transmission line sections coupled in series. The input and the output lines have corresponding taps that are coupled to the multiple transconductance elements, such that an input signal, which is applied to one end of the input line, propagates down the input line. As the input signal propagates down the input line, each successive transconductance element receives and amplifies the input signal to feed a corresponding tap into the output line. Each successive transconductance element adds to the amplified input signal.

In distributed amplifiers, input and output commensurate transmission lines are terminated with an RC network. The low frequency response is limited by the size of the capacitor. The low frequency response may be extended by employing an off chip parallel capacitor (DIE capacitor) through an inductive wire-bond. This can create both low frequency resonances and/or high frequency loading of the commensurate transmission line responses of the DA producing an undesirable response. While damping or de-Qing resistors may minimize the impact, it adds another off-chip component and increases module real-estate. Thus, there is a need for a DA to have a monolithic topology that does not rely on external components and which can resolve these parasitic effects.

SUMMARY

A distributed amplifier (DA) is disclosed having a plurality of amplifier sections, each having an input gate and an output drain, and a first plurality of inductive elements coupled in series between a DA input terminal and a gate termination terminal to form a first plurality of connection nodes. Each of the connection nodes is coupled to a corresponding adjacent pair of the first plurality of inductive elements and to a corresponding input gate of the plurality of amplifier sections. A second plurality of inductive elements is coupled in series between a drain termination terminal and a DA output terminal to form a second plurality of connection nodes, each being coupled to a corresponding adjacent pair of the second plurality of inductive elements and to a corresponding output drain of the plurality of amplifier sections. Active impedance termination circuitry has a termination output coupled to the drain termination terminal and a termination input that is coupled to a reference node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
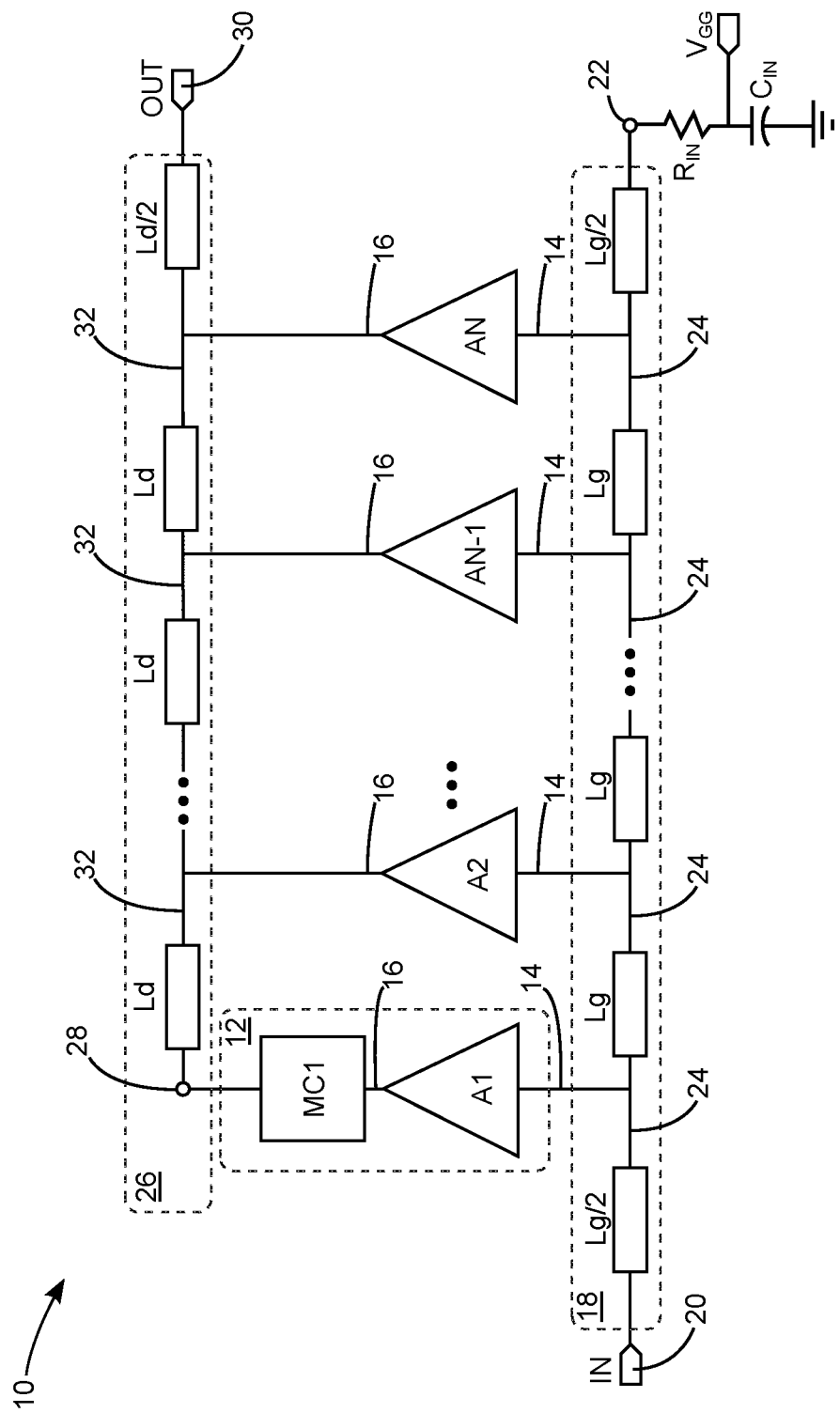
FIG. 1 is a generalized schematic diagram of a first embodiment of a distributed amplifier (DA) that includes a matched drain termination amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a generalized schematic diagram of a first embodiment of a distributed amplifier (DA) 10 that includes active impedance termination circuitry 12 that comprises an amplifier A1 and an impedance matching circuit MC1. The DA 10 has a plurality of amplifier sections A1 through AN that each have an input gate 14 and an output terminal 16, wherein N is a finite number such as 5, 10, or 100. A first plurality of inductive elements 18 are coupled in series between a DA input terminal 20 and a gate termination terminal 22 to form a first plurality of connection nodes 24. Each of the connection nodes 24 is coupled to a corresponding adjacent pair of the first plurality of inductive elements 18 and to a corresponding input gate 14. In FIG. 1, individual ones of the first plurality of inductive elements 18 are labeled Lg or Lg/2, wherein Lg/2 represents an inductive element having half the inductance of an inductive element labeled Lg.

A second plurality of inductive elements 26 is coupled in series between a drain termination terminal 28 and a DA output terminal 30 to form a second plurality of connection nodes 32. Each of the connection nodes 32 is coupled to a corresponding adjacent pair of the second plurality of inductive elements 26 and a corresponding output drain 16. In FIG. 1, individual ones of the second plurality of inductive elements 26 are labeled Ld or Ld/2, wherein Ld/2 represents an inductive element having half the inductance of an inductive element labeled Ld. The active impedance termination circuitry 12 has a termination output that is the output drain 16 coupled to the drain termination terminal 28. The active impedance termination circuitry also has a termination input that is input gate 14 that is coupled to a reference node that is at a lower potential than the drain termination terminal during operation. In the first embodiment of FIG. 1, the reference node is one of the connection nodes 24 closest to the DA input terminal 20. The reference node is ground in other embodiments.

The active impedance termination circuitry 12 provides a flat gain and matched return-loss response for baseband frequencies below 100 MHz. Moreover, the amplifier A1 of the active impedance termination circuitry 12 is realizable as a common-source feedback amplifier, a cascode feedback amplifier, or as a sacrificial transistor load. The plurality of amplifier sections A2 through AN is realizable as common-source amplifiers or cascode amplifiers. The exemplary embodiment of FIG. 1 depicts a passive gate termination comprising a resistor $R_{IN}$ coupled in series with a capacitor $C_{IN}$ between the gate termination terminal 22 and ground. A gate bias voltage $V_{GG}$ is supplied at a node between the resistor $R_{IN}$ and the capacitor $C_{IN}$. However, in at least some embodiments, the resistor $R_{IN}$ and the capacitor $C_{IN}$ are replaced with an active gate termination (AGT). However, it is to be understood that AGT is optional in all embodiments and does not limit the scope of the disclosure.

Figure 2:
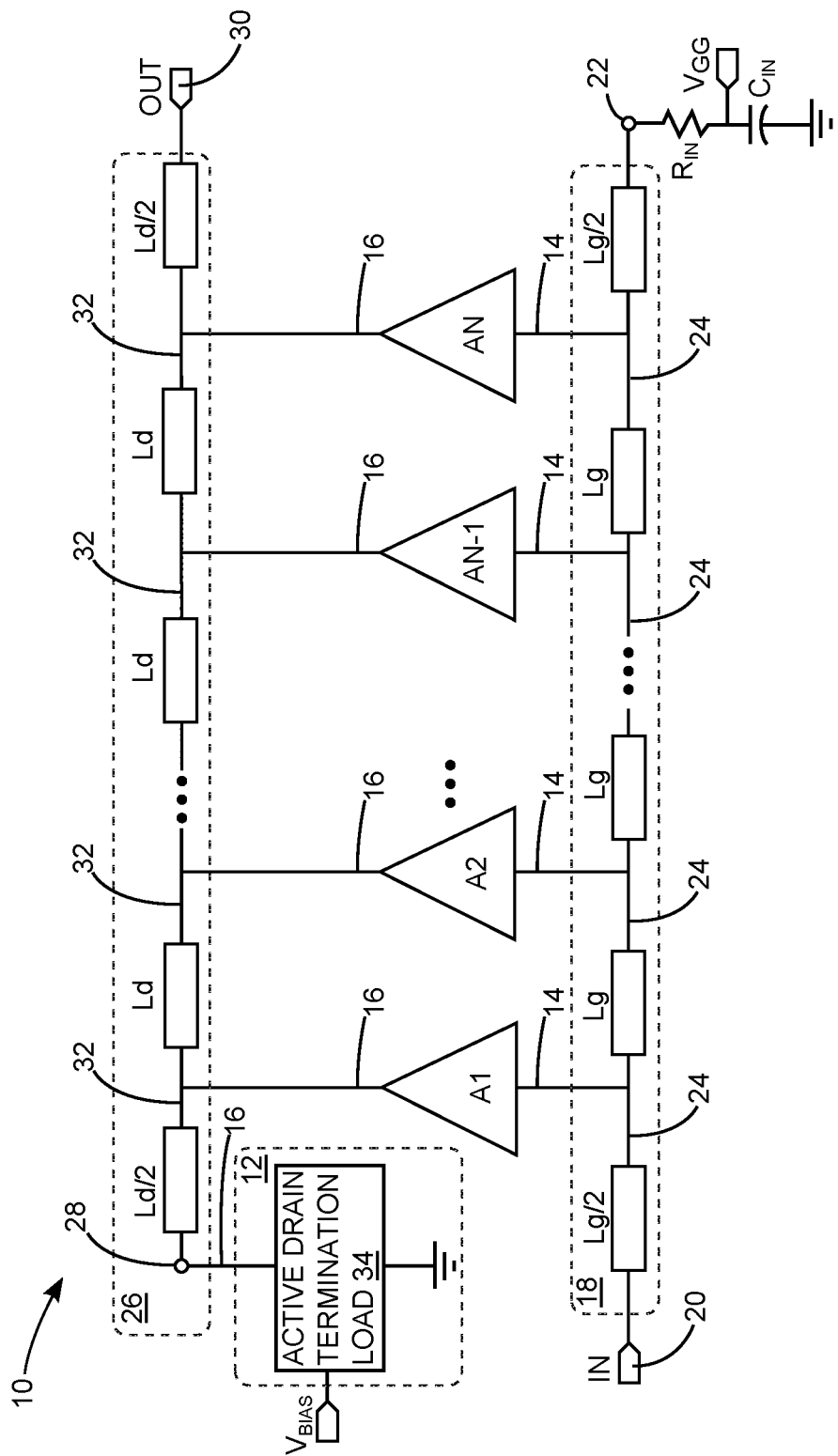
FIG. 2 is a generalized schematic diagram of a second embodiment of the DA in which active impedance termination circuitry is a matched active drain termination load that is non-amplifying.

FIG. 2 is a generalized schematic diagram of a second embodiment of the DA 10 in which the active impedance termination circuitry 12 is a matched active drain termination load 34 that is non-amplifying. The active drain termination load 34 extends a low frequency flat gain and output return-loss response to baseband frequencies that are less than 100 MHz. The active drain termination load 34 is realizable in a common-source configuration, a Cascode configuration, a common-source feedback configuration, or a cascode feedback configuration. An advantage of the active drain termination load 34 is operation at DC voltages less than or equal to a DC output voltage is provided at the DA output terminal 30. An optional $V_{BIAS}$ voltage for biasing the active load has a voltage less than or equal to the voltages supplied to the drains of the plurality of amplifier sections A1-AN.

Figure 3:
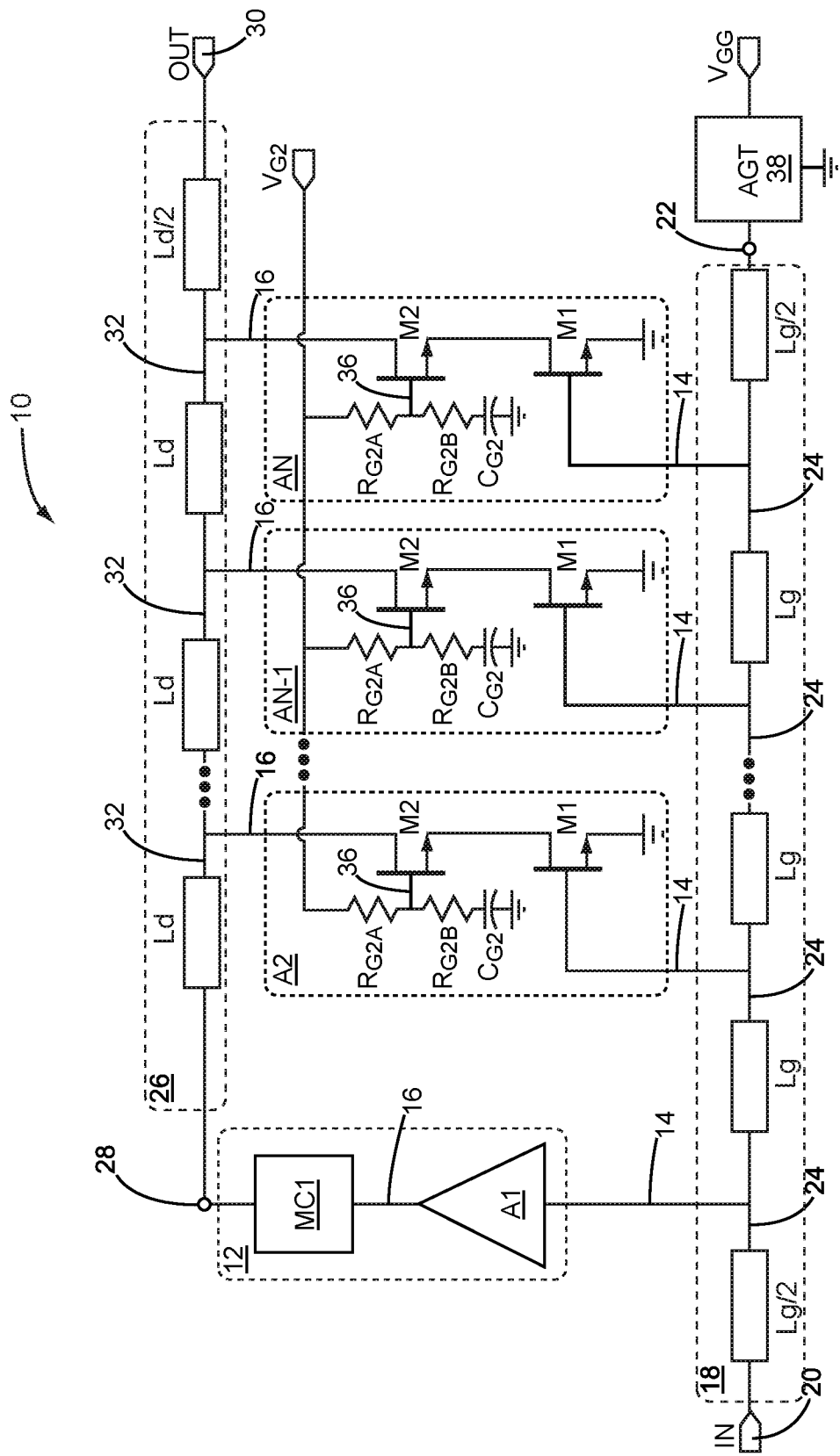
FIG. 3 is a detailed schematic of the first embodiment of the DA depicted in FIG. 1.

FIG. 3 is a detailed schematic of the first embodiment of the DA 10 depicted in FIG. 1. The first amplifier A1 is a broadband amplifier that is realizable as a common-source, a cascode feedback amplifier, or a sacrificial transistor load. Each of the amplifier sections A2 through AN is realized as a cascode amplifier comprising a first transistor M1 coupled in a cascode arrangement with a second transistor M2. The input gate 14 is the gate of the first transistor M1 and the output drain 16 is the gate of the second transistor M2. A gate 36 of the transistor M2 is coupled to a bias voltage $V_{G2}$ through a first gate resistor $R_{G2A}$. A second gate resistor $R_{G2B}$ coupled in series with a DC blocking capacitor $C_{G2}$ is coupled between the gate 36 and ground. The second gate resistor $R_{G2B}$ provides an optional means for stabilizing the overall amplifier. An active gate termination 38 coupled between the gate termination terminal and ground is employed to increase a low desired low noise response of the DA 10 for baseband frequencies below 100 MHz. However, this AGT may be substituted for a passive R-C termination network as in FIGS. 1 and 2 without departing from the present disclosure.

Figure 4:
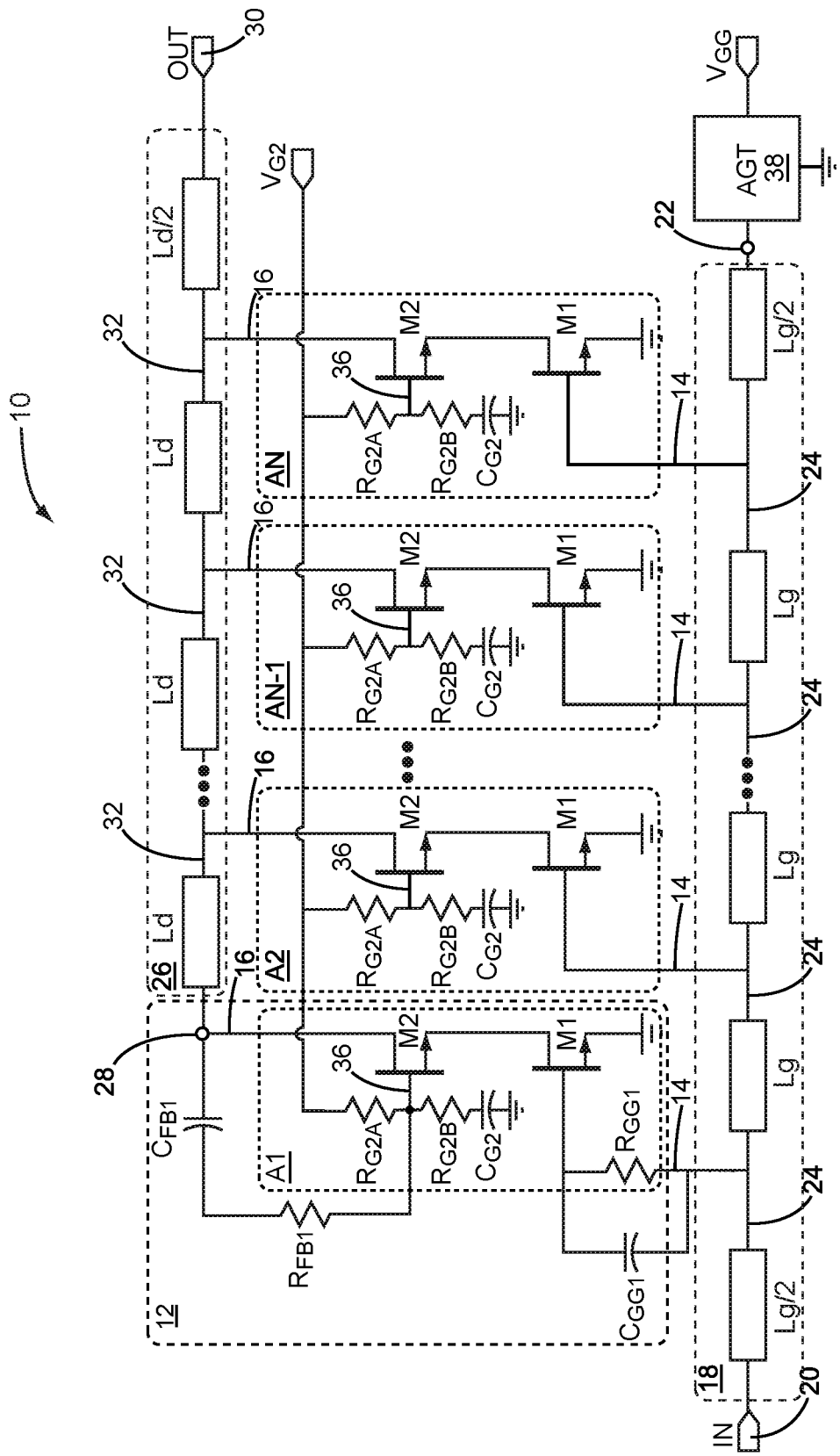
FIG. 4 is a detailed schematic of the second embodiment of the DA depicted in FIG. 2.

FIG. 4 is a detailed schematic of the second embodiment of the DA 10 depicted in FIG. 2. In this particular embodiment, the first amplifier section A1 employs feedback through a feedback capacitor $C_{FB1}$ and a feedback resistor $R_{FB1}$ that are coupled in series between the drain termination terminal 28 and the gate 36 of the transistor M2 comprising the first amplifier section A1. The feedback resistor $R_{FB1}$ can be in the form of a resistive field effect transistor (FET) to provide increased power handling. Moreover, a resistance value of the feedback resistor $R_{FB1}$ and a capacitance value of the feedback capacitor $C_{FB1}$ are adjusted to back terminate the drain output of the DA 10 in order to achieve flat gain and a desirable output return loss of greater than 10 dB at frequencies less than 100 MHz.

An input coupling RC network made up of a parallel coupling of a gate bias resistor $R_{GG1}$ and a gate capacitor $C_{GG1}$ couple the input gate 14 of the first transistor M1 of the first amplifier section A1 to the DA input terminal 20. A resistance value of the gate bias resistor $R_{GG1}$ and a capacitance value of the gate capacitor $C_{GG1}$ are adjusted to set a desired gain and bandwidth performance. The sizes of the first transistor M1 and the second transistor M2 can also be adjusted in combination with adjustments to the resistance value of feedback resistor $R_{FB1}$ and the capacitance value of the feedback capacitor $C_{FB1}$ to obtain desired gain flatness and output return-loss response. The gate capacitor $C_{GG1}$ is also used to compensate for undesirable input characteristics of the first transistor M1 of the first amplifier section A1 to extend a frequency response. However, it is to be understood that the gate capacitor can be omitted depending upon the size and the input characteristics of the first transistor M1 of the first amplifier section A1. The gate bias resistor $R_{GG1}$ provides a DC bias to the first transistor M1 of the first amplifier section A1. In some embodiments, the resistance of the first transistor M1 of the first amplifier section A1 is increased to a value greater than 10,000 Ohms to decouple the first amplifier section A1 from loading down the first plurality of inductive elements 18, which typically are in the form of a transmission line. In particular, in one embodiment, the first transistor M1 is a FET configured as a common source amplifier with the gate bias resistor $R_{GG1}$ having a resistance greater than 500 Ohms. In another embodiment, the first transistor M1 is a FET configured as a common source amplifier with the gate bias resistor $R_{GG1}$ having a resistance greater than 1,000 Ohms. In yet another embodiment, the first transistor M1 is a FET configured as a common source amplifier with the gate bias resistor $R_{GG1}$ having a resistance greater than 10,000 Ohms.

Figure 5:
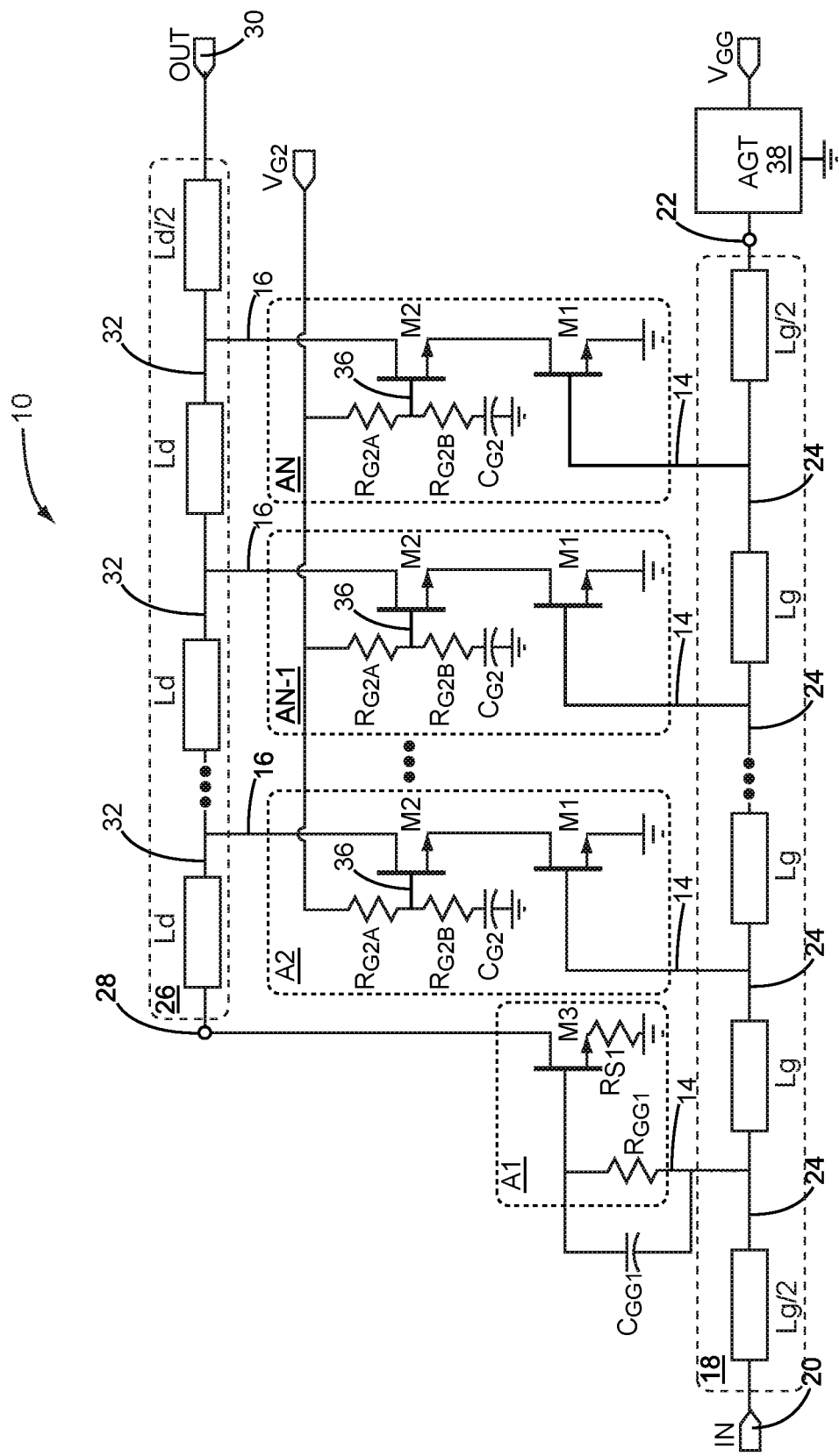
FIG. 5 is a detailed schematic of a third embodiment of the DA that is configured as a common source amplifier in accordance with the present disclosure.

FIG. 5 is a detailed schematic of a third embodiment of the DA that is configured as a common source amplifier accordance with the present disclosure. In particular, the first amplifier section A1 is configured as a common-source amplifier in order to extend the low frequency flat gain and matched output return-loss response to baseband frequencies that are less than 100 MHz and to provide a return-loss that is greater than 10 dB. A third transistor M3 is employed in a common source configuration to provide a relatively higher breakdown voltage. A relatively longer gate length and/or relatively longer gate-drain spacing for the third transistor M3 with respect to the first transistor M1 and the second transistor M2 is desired because whereas voltage is divided across the first transistor M1 and the second transistor M2 equally, the third transistor M3 must withstand a higher voltage level. In some embodiments, the third transistor M3 includes a first source feedback resistor $R_{S1}$ that is used to adjust drain impedance of the DA 10.

Figure 6:
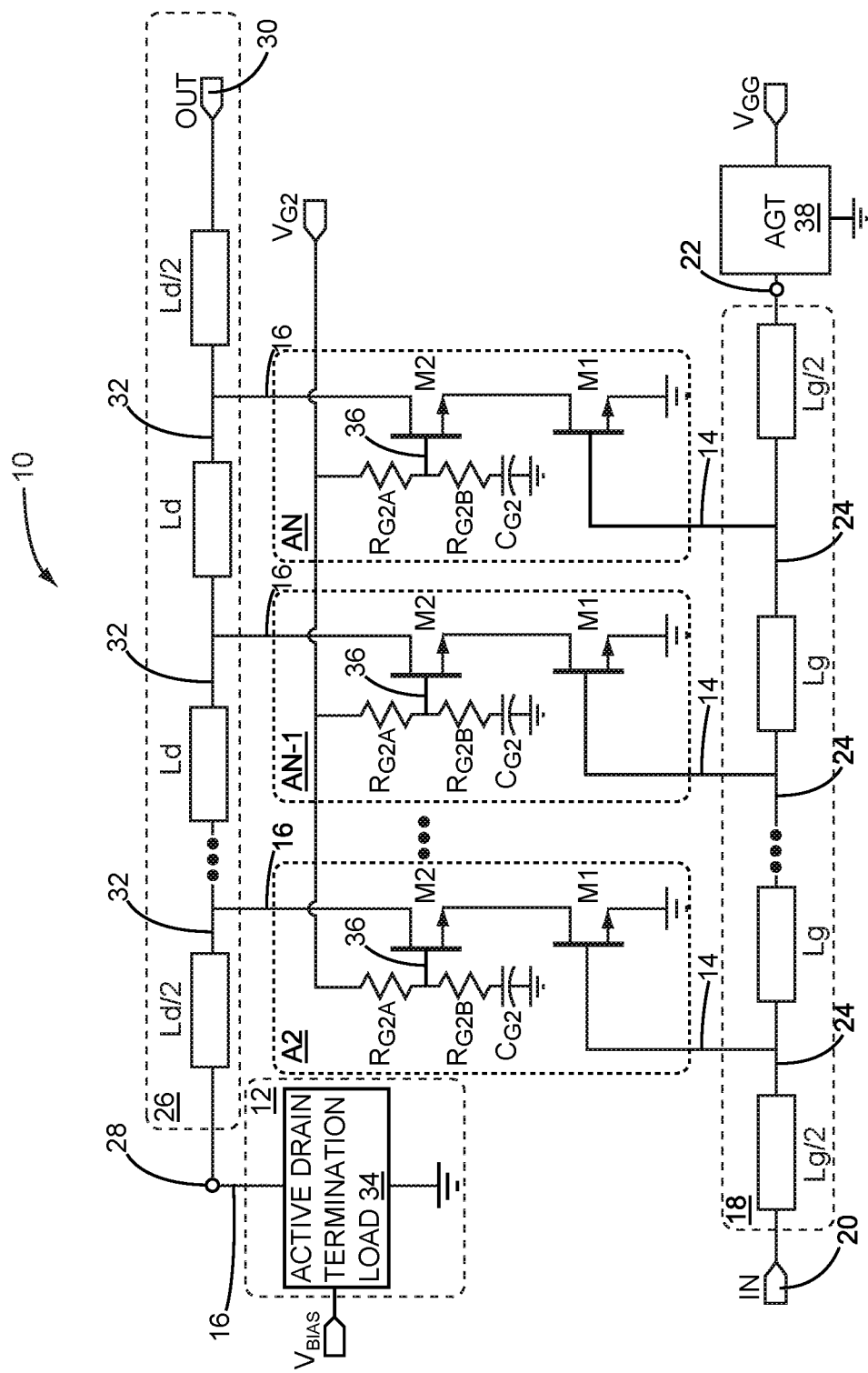
FIG. 6 is a detailed schematic of a fourth embodiment of the DA that includes an active drain termination load along with cascode amplifiers that increase operating bandwidth of the DA.

FIG. 6 is a detailed schematic of a fourth embodiment of the DA 10 in which each of the amplifier sections A2 through AN is in a cascode amplifier configuration that increases operating bandwidth of the DA 10. The active drain termination load 34 operates from a bias potential that is no greater than the output drain terminal potential of the successive amplifying sections A2 through AN. Thus, the bias voltage $V_{BIAS}$ should be no greater than the drain output voltage at the connection nodes 32 and no greater than the drain voltage at the DA output terminal 30.

Figure 7:
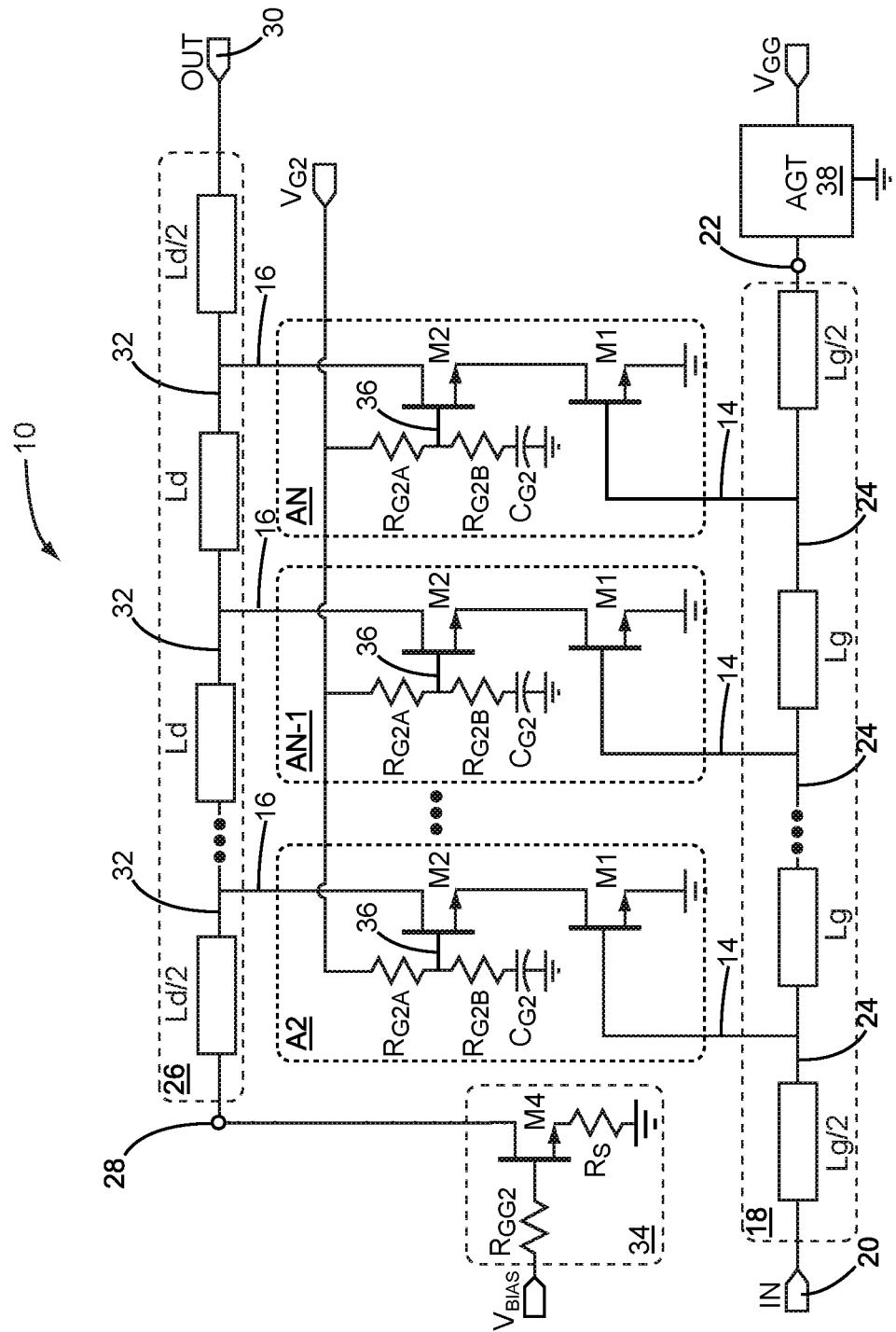
FIG. 7 is a detailed schematic of a fifth embodiment of the DA 10 that includes an exemplary configuration for the active drain termination load 34.

FIG. 7 is a detailed schematic of a fifth embodiment of the DA 10 that includes an exemplary configuration for the active drain termination load 34. In this case, a fourth transistor M4 is coupled between the drain termination terminal 28 and ground, wherein a source feedback resistor $R_S$ is coupled between the source of the fourth transistor M4 and ground. The source feedback resistor $R_S$ is used to adjust drain impedance of the DA 10. A relatively longer gate length and/or relatively longer gate-drain spacing for the fourth transistor M4 with respect to the first transistor M1 and the second transistor M2 is desired because whereas voltage is divided across the first transistor M1 and the second transistor M2 equally, the fourth transistor M4 must withstand a higher voltage level.

To illustrate the feasibility and potential performance benefit of embodiments of this disclosure, the third embodiment of DA 10 depicted in FIG. 5 was used to design a 100 Gbaud/s fiber optic modulator driver using a state-of-the-art Enhancement-mode GaN HEMT technology, which possesses transition frequencies greater than 300 GHz. The third embodiment of DA 10 is compared to a conventional resistively terminated approach to illustrate feasibility of the disclosed embodiments of DA 10 that provide extended baseband performance without compromising mm-wave bandwidth or overall linearity performance. Note that a 3 dB upper bandwidth of 70 GHz is sufficient for supporting 100 Gbaud/s.

Figure 8:
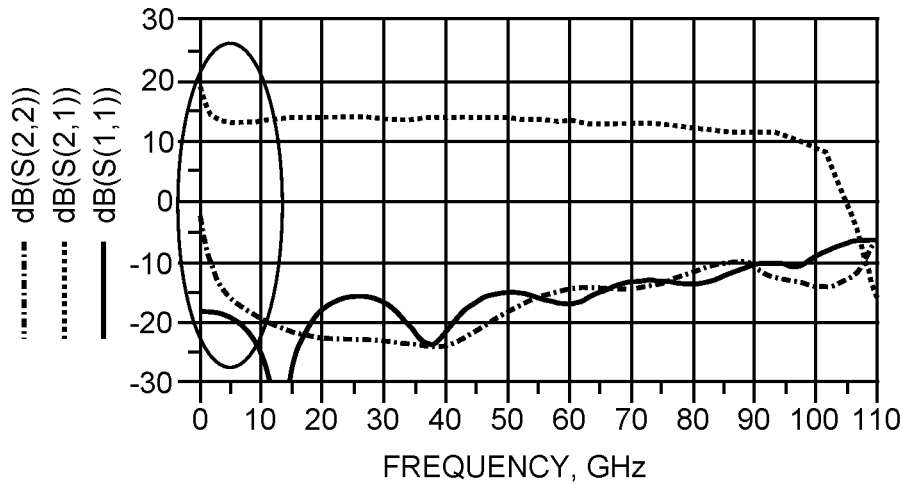
FIG. 8 is a graph depicting a simulation of broadband S-parameters for a related art resistive drain termination.

FIG. 8 is a graph depicting a simulation of broadband S-parameters for a related art resistive drain termination. The ellipse enclosing the lower frequency section of the S-parameter traces shows a departure from response flatness that is not present in the response of the third embodiment of DA 10.

Figure 9:
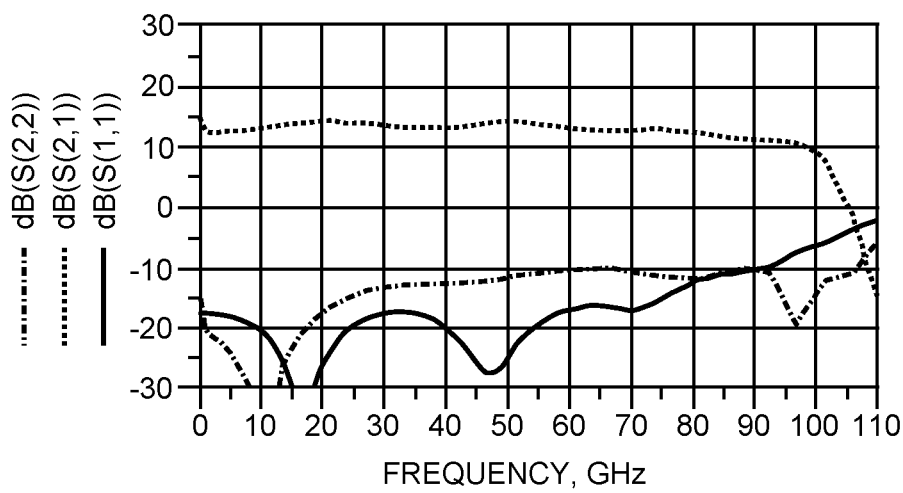
FIG. 9 is a graph depicting a simulation of broadband S-parameters for the third embodiment of the DA that includes active drain termination.

FIG. 9 is a graph depicting a simulation of broadband S-parameters for the third embodiment of the DA 10. The conventional resistive DA with monolithic RC drain termination shows limited low frequency gain flatness and S22 using a 2 pF bypass capacitor and 50 ohm thin film resistor for the RC drain termination. The use of larger metal-insulator-metal (MIM) capacitors can result in undesirable in-band resonances. In comparison, the same design employing the third embodiment of the DA 10 achieves low frequency baseband performance without significantly compromising the 100 GHz 3 dB gain-bandwidth.

Figure 10:
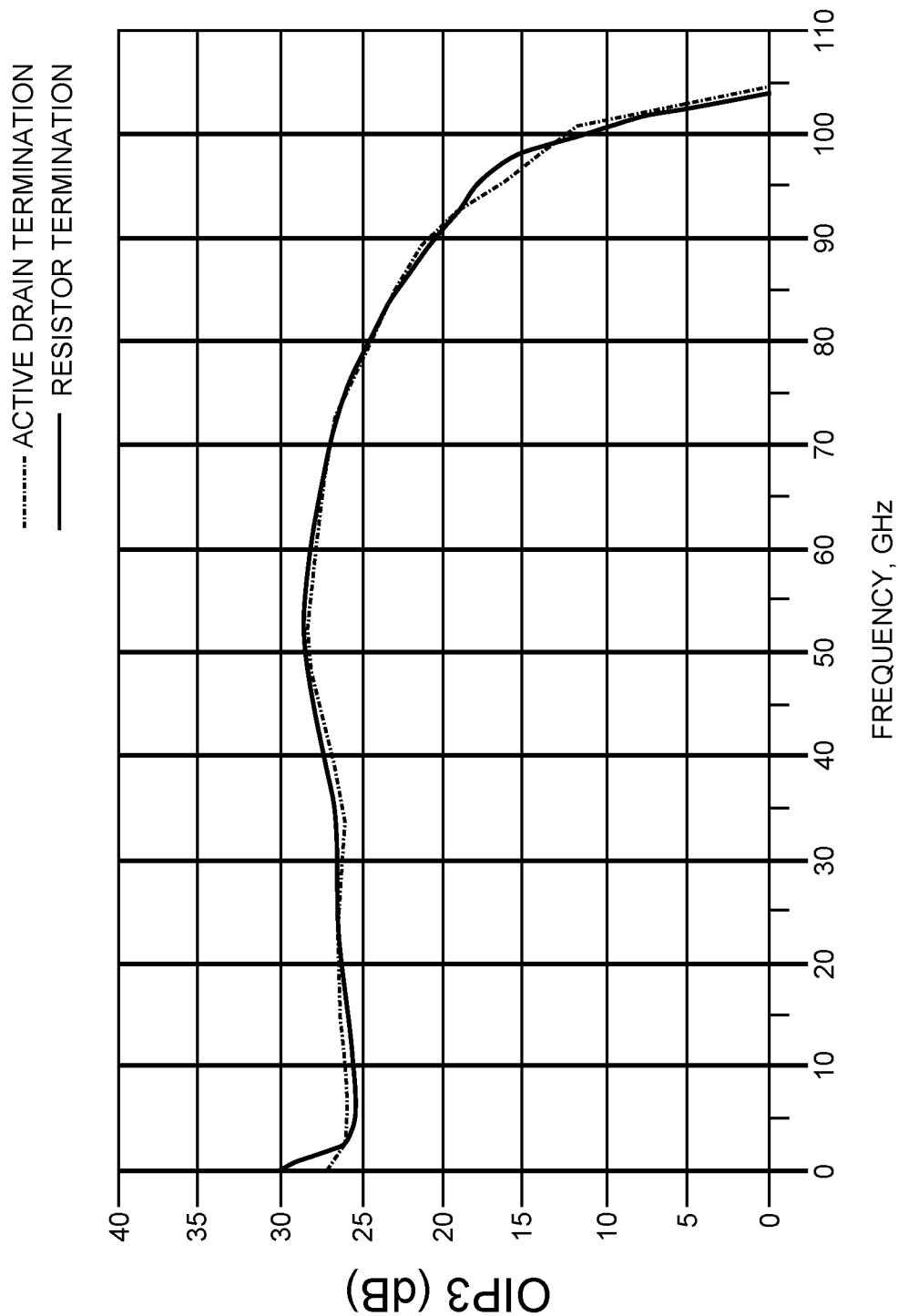
FIG. 10 is a graph depicting a third order intercept point (IP3) linearity comparison between related art resistive termination and the active drain termination of the third embodiment of this disclosure.

FIG. 10 is a graph depicting third order intercept point (IP3) linearity comparison between related art resistive termination and the active drain termination of the third embodiment of this disclosure. Notice that no degradation in IP3 linearity performance is observed across a broad band. Also note that at low frequencies, the resistive design does not have a linearity peak whenever off chip capacitors are implemented to flatten out the baseband gain.

Figure 11:
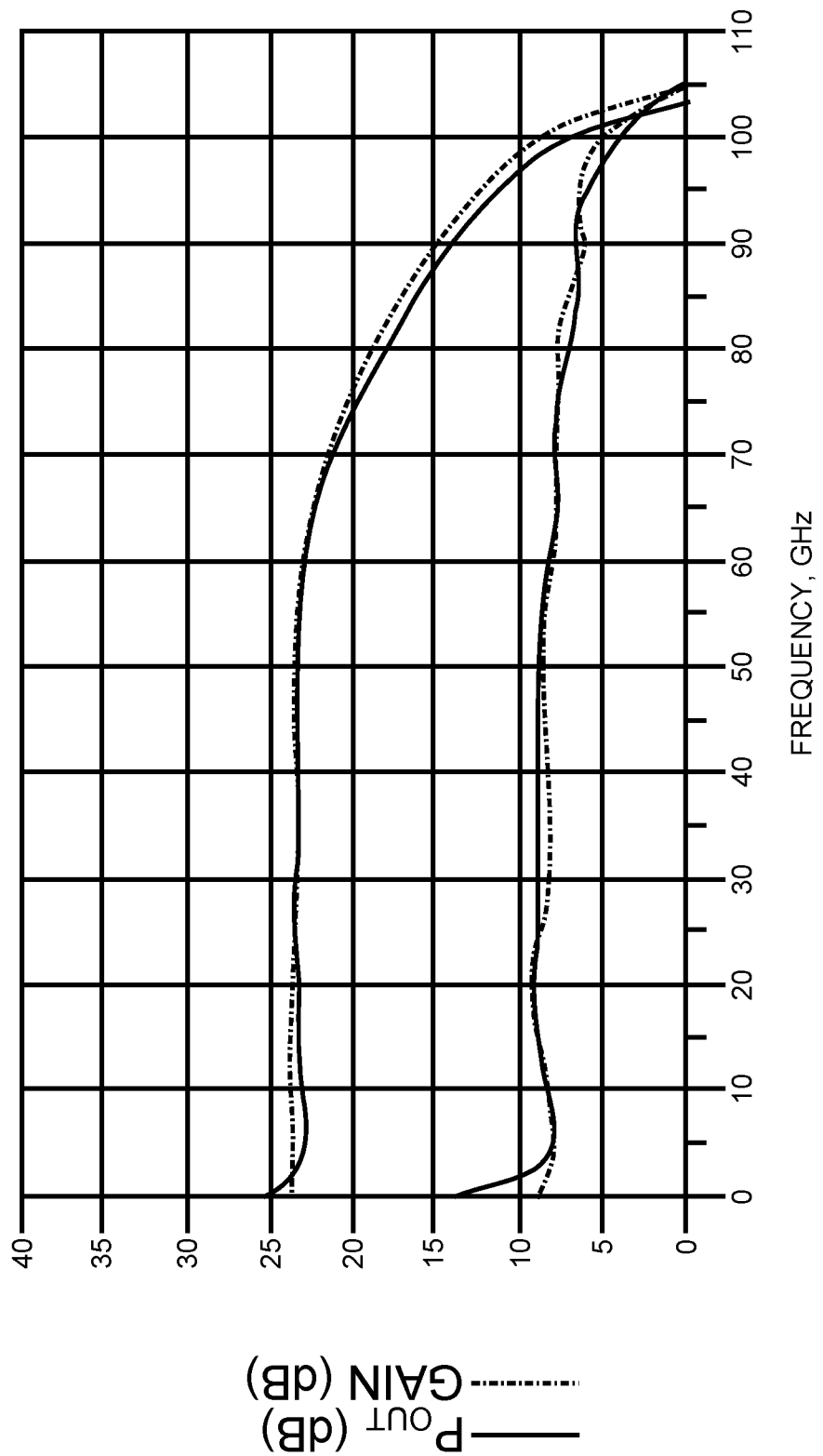
FIG. 11 is a graph depicting a P5dB comparison between related art resistive termination and active drain termination of the third embodiment of this disclosure.

FIG. 11 is a graph depicting a P5dB comparison between related art resistive termination and active drain termination of the third embodiment of this disclosure. The comparison of simulations of both the related art resistive termination and the active drain termination of the third embodiment show no significant P5dB or G5dB performance degradation across a band over which the simulations were conducted, with an exception of an anomalous low frequency response of the resistive design. The anomalous low frequency response is an upward departure in output power $P_{OUT}$ and Gain at baseband frequencies. Notice that signal gain between the DA input terminal and the DA output terminal remains within 3 dB of an ideal flat response over a bandwidth that ranges between 0 Hz and approximately 100 GHz.

Figure 13:
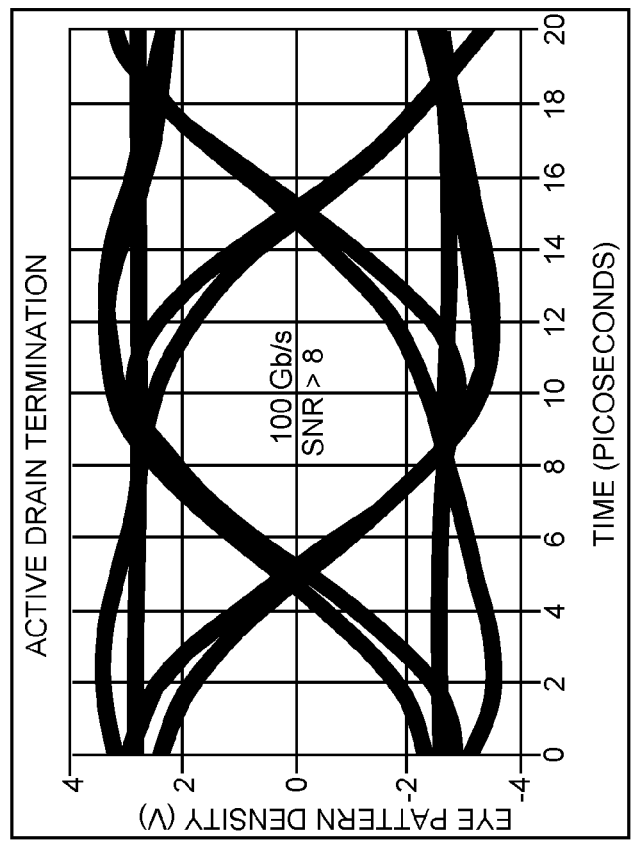
FIG. 13 is an eye diagram for the active drain terminated DA of the third embodiment.
Figure 12:
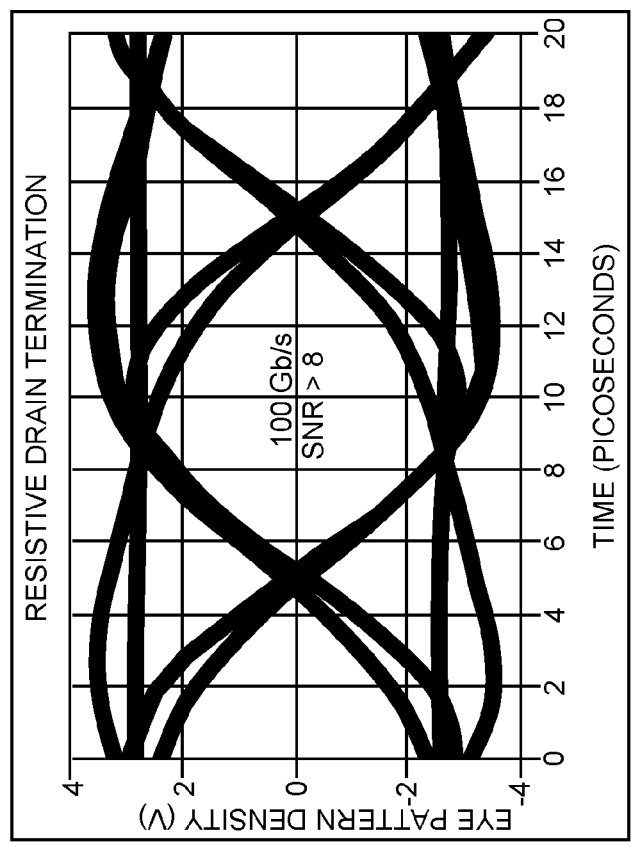
FIG. 12 is an eye diagram for a related art resistive drain terminated DA.

FIG. 12 is a simulated 100 Gb/s eye diagram for a related art resistive drain terminated DA and FIG. 13 is a simulated 100 Gb/s eye diagram for the active drain terminated DA 10 of the third embodiment of the present disclosure. A comparison of the simulated eye diagrams shows no significant performance degradation between the related art resistive terminated design and the active drain terminated design of the third embodiment of the present disclosure, both achieving signal-to-noise ratios of >8 dB at 100 Gb/s. This demonstrates the low frequency feasibility of the embodiments of the DA 10 of the present disclosure. A benefit of the DA 10 of the present disclosure is an elimination of off-chip tuning that is typically required to achieve the 100 Gbps response. Moreover, it is particularly challenging for a typical monolithic microwave integrated circuit (MMIC) to achieve 100 GHz of flat gain-bandwidth without off-chip tuning. As a result, embodiments of the DA 10 are usable to realize MMICs that eliminate off-chip tuning making embodiments of the DA 10 particularly attractive for integration into advanced communication systems. Examples of advanced communication systems that can benefit from embodiments of the DA 10 include, but are not limited to fiber optic integrated circuit (IC) communications, communication systems instrumentation, software defined radios, and high power military/defense communications.

Those skilled in the art will recognize improvements and modifications to the preferred embodiments of the present disclosure. All such improvements and modifications are considered within the scope of the concepts disclosed herein and the claims that follow.

What is claimed is:

1. A distributed amplifier (DA) comprising:
a plurality of amplifier sections that each has an input gate and an output drain;
a first plurality of inductive elements coupled in series between a DA input terminal and a gate termination terminal to form a first plurality of connection nodes, each being coupled to a corresponding adjacent pair of the first plurality of inductive elements and to a corresponding input gate of the plurality of amplifier sections;
a second plurality of inductive elements coupled in series between a drain termination terminal and a DA output terminal to form a second plurality of connection nodes, each being coupled to a corresponding adjacent pair of the second plurality of inductive elements and to a corresponding output drain of the plurality of amplifier sections; and
active impedance termination circuitry having a termination output coupled to the drain termination terminal and a termination input that is coupled to a reference node, wherein the active impedance termination circuitry includes a first one of the plurality of amplifier sections configured as a common source amplifier and remaining ones of the plurality of amplifier sections configured as cascode amplifiers.

2. The DA of claim 1 wherein the reference node is at lower potential than the drain termination terminal during operation.

3. The DA of claim 1 wherein the reference node is one of the first plurality of connection nodes closest to the DA input terminal.

4. The DA of claim 1 wherein the active impedance termination circuitry does not include a termination resistor.

5. The DA of claim 1 wherein the first one of the plurality of amplifier sections is a field effect transistor (FET) configured as a common source amplifier having increased drain to gate spacing relative to a drain to gate spacing of remaining ones of the plurality of amplifier sections.

6. The DA of claim 1 wherein the first one of the plurality of amplifier sections is a FET configured as a common source amplifier with a source resistor having a resistance value that determines drain terminal impedance at the drain termination terminal.

7. The DA of claim 1 wherein the first one of the plurality of amplifier sections is a FET configured as a common source amplifier with a gate bias resistor that has a resistance greater than 10,000 Ohms.

8. The DA of claim 1 wherein the first one of the plurality of amplifier sections is a FET configured as a common source amplifier with a gate bias resistor that has a resistance greater than 1,000 Ohms.

9. The DA of claim 1 wherein the first one of the plurality of amplifier sections is a FET configured as a common source amplifier with a gate bias resistor that has a resistance greater than 500 Ohms.

10. The DA of claim 1 wherein the first one of the plurality of amplifier sections is a FET configured as a common source amplifier with a gate resistor and a gate capacitor coupled in parallel between a gate of the FET and the reference node.

11. The DA of claim 1 wherein the first one of the plurality of amplifier sections comprises a first FET and a second FET configured as a cascode amplifier such that the first FET has a gate input coupled to the reference node and the second FET has a drain output coupled to the drain termination terminal.

12. The DA of claim 11 wherein the second FET has a gate coupled to the drain termination terminal through a feedback resistor and a feedback capacitor that are coupled in series.

13. The DA of claim 12 wherein the feedback resistor is a resistive FET.

14. The DA of claim 11 wherein a gate of the second FET is coupled to ground through a gate resistor and a gate capacitor coupled in series.

15. The DA of claim 11 wherein a gate of the second FET is coupled to ground through a gate capacitor.

16. The DA of claim 1 further including an active gate termination coupled to the gate termination terminal.

17. The DA of claim 1 wherein signal gain between the DA input terminal and the DA output terminal remains within 1 dB of an ideal flat response over a bandwidth that ranges between 0 Hz and 50 GHz during operation.

18. The DA of claim 1 wherein signal gain between the DA input terminal and the DA output terminal remains within 1 dB of an ideal flat response over a bandwidth that ranges between 0 Hz and 100 GHz during operation.

19. The DA of claim 1 wherein the active impedance termination circuitry is a non-amplifying load during operation.

20. The DA of claim 1 wherein a bias voltage for the active impedance termination circuitry is no greater than an output voltage at the DA output terminal during operation.

21. The DA of claim 1 wherein a bias voltage for the active impedance termination circuitry is no greater than a drain voltage of any one of the plurality of amplifier sections during operation.

\* \* \* \* \*